United States Patent [19]
Matui et al.

[11] Patent Number: 5,448,203
[45] Date of Patent: Sep. 5, 1995

[54] NEGATIVE-FEEDBACK AMPLIFIER AND FEEDBACK CONTROLLING METHOD THEREOF

[75] Inventors: Hitosi Matui; Hideho Tomita; Takeshi Yamamoto, all of Tokyo, Japan

[73] Assignee: NEC Corporation, Japan

[21] Appl. No.: 224,420

[22] Filed: Apr. 8, 1994

[30] Foreign Application Priority Data

Apr. 9, 1993 [JP] Japan .................................. 5-105951

[51] Int. Cl.6 ............................................. H03F 1/34
[52] U.S. Cl. ...................... 330/149; 455/126; 330/107
[58] Field of Search .................. 330/107, 109, 149; 329/306, 349; 332/159, 160, 161, 162; 455/126

[56] References Cited

U.S. PATENT DOCUMENTS

| | | | |
|---|---|---|---|
| 4,268,802 | 5/1981 | Fisher et al. ........................ | 332/162 |
| 4,700,151 | 10/1987 | Nagata ............................... | 455/126 X |
| 5,075,635 | 12/1991 | Boulanger et al. ................. | 330/149 |

*Primary Examiner*—Steven Mottola
*Attorney, Agent, or Firm*—Ostrolenk, Faber, Gerb & Soffen

[57] ABSTRACT

A negative-feedback amplifier prevents deterioration of the open-loop gain and the distortion improvement effect despite changes in a sending frequency by demodulating a baseband signal from a carrier and an output signal of an amplifier and a demodulated baseband signal. The negative-feedback amplifier includes a correcting member for correcting a phase error of the demodulated baseband signal caused by a delay in the amplifier for each change of a sending frequency of the carrier.

16 Claims, 3 Drawing Sheets

NEGATIVE-FEEDBACK AMPLIFIER AND FEEDBACK CONTROLLING METHOD THEREOF

BACKGROUND OF THE INVENTION

The present invention relates to a negative-feedback amplifier and, in particular, relates to an apparatus and method for controlling a phase of a demodulated baseband signal.

In the field of radio communication using Multi Channel Access, there is a problem related to the relationship between power efficiency and linearity, that is, if the power efficiency of a power amplifier located at the last stage of a transmitter is increased, the nonlinear distortion of the power amplifier becomes large.

Because of the above relationship, in the case of high density digital transmission, for example, in the case of sending a signal modulated by a linear modulation method such as 16 QAM (Quadrature Amplitude Modulation), deterioration of the transmission spectrum caused by nonlinearity of an amplifier can not be avoided.

For compensating for this deterioration, an apparatus and method to restrain distortion using a negative-feedback circuit has been developed. Specifically, the method seeks to obtain a high open-loop gain for a signal in a high frequency band. Such a method is described in "Reduction Of Spurious Emission From Radio Transmission By Means Of Modulation Feedback" by V. Petrovic, IEEE Conf. Radio Spectrum Conservation Tech., September 1993.

In this method, an output signal of a power amplifier is demodulated and the demodulated signal is fed back in the form of a baseband signal.

FIG. 3 illustrates a block diagram of a negative-feedback amplifier using this method.

X1(t), Y1(t) are components of a two-dimensional baseband signal.

31 is a subtracter for subtracting a two-dimensional demodulated baseband signal (described later) from the two-dimensional baseband signals which are generated from transmission data in an external circuit (not shown in this figure) and independent of each other.

32 is a low pass filter for limiting the frequency band of an output of the subtracter 31.

33 is a modulator for QA (Quadrature Amplitude)-modulating a two-dimensional carrier signal (described later) with a two-dimensional signal output from the low pass filter 32 and for outputting a modulated signal.

34 is a carrier generator for outputting a two-dimensional carrier signal for modulation and demodulation.

35 is an amplifier for amplifying the modulated signals output from the modulator 33.

36 is a phase shifter for adjusting the phase of an output signal output from the amplifier 35.

37 is a demodulator for demodulating a two-dimensional demodulated baseband signal from the output signal of the phase shifter 36 and the two-dimensional carrier signal and for outputting a result.

Next, an operation of the negative-feedback apparatus described above is explained.

First, a two-dimensional baseband signal X1(t), Y1(t) is generated from transmission data in an external circuit for QA-modulation, and is supplied to the subtracter 31. The subtracter 31 subtracts a two-dimensional demodulated baseband signal that is output from the demodulator 37 from the two-dimensional baseband signal X1(t), Y1(t).

The low pass filter 32 that receives this subtraction result limits the frequency band of the feedback circuit.

Next, the carrier generator 34 outputs a two-dimensional carrier signal $\cos(\omega c \times t)$, $\sin(\omega c \times t)$, which are orthogonal to each other, wherein, $\omega c$ is the angular frequency of the carrier.

The modulator 33 QA-modulates the two-dimensional carrier signal $\cos(\omega c \times t)$, $\sin(\omega c \times t)$ with the two-dimensional signal X3(t), Y3(t), and outputs a modulated signal Z(t).

$$Z(t) = X3(t) \times \cos(\omega c \times t) + X3(t) \times \sin(\omega c \times t) \qquad (1)$$

The modulated signal Z(t) is amplified by the amplifier 35 and sent out via an antenna (not shown in the figure).

Next, the phase shifter 36 that receives a part of the output signal output from the amplifier 35 adjusts the phase of the output signal of the amplifier 35 for preventing deterioration of the open-loop gain caused by circuit delay. The demodulator 37 demodulates the two-dimensional demodulated baseband signal from an output of this phase shifter (36) and the two-dimensional carrier signal $\cos(\omega c \times t)$, $\sin(\omega c \times t)$ output from the carrier generator 34 and outputs a result.

Here, supposing that a gain of the amplifier 35 is G, a delay from input to output in the amplifier 35 is $\delta$, the ratio of output of the amplifier 35 that is distributed to the phase shifter 36 is R and the phase shifter 36 does not adjust the phase, the two-dimensional demodulated baseband signal P(t), Q(t) is represented by the equations (2) and (3).

$$P(t) = G \times R \times \{X3(t-\delta) \times \cos(\omega c \times \delta) - Y3(t-\delta) \times \sin(\omega c \times \delta)\} \qquad (2)$$

$$Q(t) = G \times R \times \{Y3(t-\delta) \times \cos(\omega c \times \delta) + X3(t-\delta) \times \sin(\omega c \times \delta)\} \qquad (3)$$

However, for the two-dimensional demodulated baseband signal P(t), Q(t) in the equations (2) and (3), there may be a condition, $\cos(\omega c \times \delta) \neq 1$.

In the two-dimensional demodulated baseband signal P(t), Q(t) at this time, the respective components of second terms $Y3(t-\delta) \times \sin(\omega c \times \delta)$ and $X3(t-\delta) \times \sin(\omega c \times \delta)$ are leaked signals against the respective components of the first terms $X3(t-\delta) \times \cos(\omega c \times \delta)$ and $Y3(t-\delta) \times \cos(\omega c \times \delta)$. That is, the following equations are not realized.

$Y3(t-\delta) \times \sin(\omega c \times \delta) = 0$.

$X3(t-\delta) \times \sin(\omega c \times \delta) = 0$.

Under this condition, the distortion improvement effect can not be obtained sufficiently because open-loop gain is equivalently reduced, or occasionally positive feedback may occur and the circuit oscillates.

Then, to avoid such deterioration, the phase is adjusted in the phase shifter 36.

Here, supposing that a delay in the phase shifter 36 is $\tau$, and the phaser shifter 36 adjusts the phase for $\omega c \times \tau$, the two-dimensional demodulated baseband signal P(t), Q(t) output from the demodulator 37 is represented by the following equations.

$$P(t) = G \times R \times [X3(t-\delta) \times \cos\{\omega c \times (\delta+\tau)\} - Y3(t-\delta) \times \sin\{\omega c \times (\delta+\tau)\}] \qquad (4)$$

$$Q(t) = G \times R \times [Y3(t-\delta) \times \cos\{\omega c \times (\delta + \tau)\} + X3(t-\delta) \times \sin\{\omega c \times (\delta + \tau)\}] \quad (5)$$

Therefore, by determining $\omega c \times \tau$ so as to realize the following equation (6), both the components of the second terms of the equations (4) and (5), $Y3(t-\delta) \times \sin\{\omega c \times (\delta + \tau)\}$ and $X3(t-\delta) \times \sin\{\omega c \times (\delta + \tau)\}$ becomes 0, only components of the first term remain. Thus, the above problem can be avoided.

$$\omega c \times (\delta + \tau) = 2 \times n \times \pi \text{ (n is an integer)} \quad (6)$$

Thus, a negative-feedback amplifier that feeds back a signal in the form of a baseband signal can be configured.

In the negative-feedback amplifier described above, however, when the delay $\delta$ of the amplifier 35 has frequency characteristics against a sending frequency (in the carrier angular frequency $\omega c = 2 \times \pi \times f$, this f is the sending frequency), the equation (6) may not be realized if the sending frequency changes because the quantity $\omega c \times \tau$ is fixed at a predetermined value in the above negative-feedback amplifier.

As a result, for a system that changes the sending frequency, the open-loop gain and distortion improvement effect in the above negative-feedback amplifier deteriorate.

SUMMARY OF THE INVENTION

The object of the present invention is to provide, for solving the above-mentioned problem, a negative-feedback amplifier for preventing deterioration of the open-loop gain and the distortion improvement characteristics despite changes occurring in the sending frequency.

The above object is achieved by a negative-feedback amplifier that demodulates a baseband signal from a carrier and an output signal of an amplifier and feeds back a demodulated baseband signal, the negative-feedback amplifier comprising a correcting means for correcting a phase error of the demodulated baseband signal caused by a delay in the amplifier for each change of a sending frequency of the carrier.

Moreover, it is desirable that the correcting means comprises:
a detecting means for detecting a phase error of the demodulated baseband signal caused by a delay in the amplifier for each change of a sending frequency of the carrier; and
a first phase controlling means for controlling the phase of an output signal of the amplifier so as to extinguish a phase error of the demodulated baseband signal based on a detected phase error of the demodulated baseband signal.

Moreover, it is desirable that the detecting means comprises:
a reference signal generating means for generating a reference signal;
a subtracting means for subtracting the demodulated baseband signal from the reference signal and outputting a subtraction signal; and
a phase difference detecting means for detecting a phase difference between the reference signal and the subtraction signal.

Moreover, it is desirable that the first phase controlling means comprises:
a phase shift quantity calculating means for calculating a phase shift quantity of an output signal of the amplifier so as to extinguish a phase error of the demodulated baseband signal based on a detected phase difference; and
a phase shifting means for receiving a phase shift quantity calculated by the phase shift quantity calculating means and shifting the phase of an output signal of the amplifier based on this phase shift quantity.

Moreover, the present invention is achieved by a second phase controlling means for controlling the phase of the carrier so as to extinguish a phase error of the demodulated baseband signal based on a detected phase error of the demodulated baseband signal, instead of the first phase controlling means.

Moreover, it is desirable that the second phase controlling means comprises:
a phase shift quantity calculating means for calculating a phase shift quantity of the carrier so as to extinguish a phase error of the demodulated baseband signal based on a detected phase difference; and
a phase shifting means for receiving a phase shift quantity calculated by the phase shift quantity calculating means and shifting the phase of the carrier based on this phase shift quantity.

Moreover, it is desirable that the correction means comprises:
a reference signal generating means for generating a reference signal;
a subtracting means for subtracting the demodulated baseband signal from the reference signal and outputting a subtraction signal;
a phase difference detecting means for detecting a phase difference between the reference signal and the subtraction signal;
a phase shift quantity calculating means for calculating a phase shift quantity of an output signal of the amplifier so as to extinguish a phase error of the demodulated baseband signal based on a detected phase difference; and
a phase shifting means for receiving a phase shift quantity calculated by the phase shift quantity calculating means and shifting the phase of an output signal of the amplifier based on this phase shift quantity.

Moreover, it is desirable that the correcting means comprises:
an indicating means for outputting an indication signal to indicate a start of correction for a phase error of the demodulated baseband signal; and
a selecting means for outputting a reference signal supplied from the reference signal generating means when having received the indication signal.

Moreover, it is desirable that the correcting means comprises:
a reference signal generating means for generating a reference signal;
a subtracting means for subtracting the demodulated baseband signal from the reference signal and outputting a subtraction signal;
a phase difference detecting means for detecting a phase difference between the reference signal and the subtraction signal;
a phase shift quantity calculating means for calculating a phase shift quantity of the carrier so as to extinguish a phase error of the demodulated baseband signal based on a detected phase difference; and a phase shifting means for receiving a phase shift quantity calculated by the phase shift quantity calculating means and shifting the phase of the carrier based on this phase shift quantity.

Moreover, it is desirable that the correcting means comprises:

an indicating means for outputting an indication signal to indicate a start of correction for a phase error of the demodulated baseband signal; and a selecting means for outputting a reference signal supplied from the reference signal generating means when having received the indication signal.

The object of the present invention is achieved by a negative-feedback amplifier comprising:

an indicating means for outputting a correction indication signal to indicate a start of correction and a change of a sending frequency;

a carrier generating means for generating a predetermined carrier by changing the sending frequency when having received the correction indication signal;

a reference signal generating means for generating a reference signal;

a selecting means for receiving a baseband signal and the reference signal and in a normal operation, outputting the baseband signal, and outputting the reference signal when having received the correction indication signal;

a subtracting means for subtracting the demodulated baseband signal from an output of the selector;

a low pass filtering means for receiving an output signal of the subtracter and limiting the frequency band of this output signal;

a modulating means for modulating the carrier with an output signal of the low pass filtering means and outputting a modulated signal;

an amplifying means for amplifying the modulated signal;

a phase difference detecting means for detecting a phase difference between an output signal of the low pass filtering means and the reference signal;

a phase shifting means for calculating a phase shift quantity of an output signal of the amplifying means so as to extinguish a phase error of the demodulated baseband signal based on a detected phase difference detected by the phase difference detecting means when having received the indication signal; and a demodulating means for demodulating the demodulated baseband signal from the carrier and an output signal of the amplifier that has been phase-shifted by the phase sifting means.

Moreover, the object of the present invention is achieved by a negative-feedback amplifier comprising:

an indicating means for outputting a correction indication signal to indicate a start of correction and a change of a sending frequency;

a carrier generating means for generating a predetermined carrier by changing the sending frequency when having received the correction indication signal;

a reference signal generating means for generating a reference signal;

a selecting means for receiving a baseband signal and the reference signal and in a normal operation, outputting the baseband signal, and outputting the reference signal when having received the correction indication signal;

a subtracting means for subtracting the demodulated baseband signal from an output of the selector;

a low pass filtering means for receiving an output signal of the subtracter and limiting a frequency band of this output signal;

a modulating means for modulating the carrier with an output signal of the low pass filtering means;

an amplifying means for amplifying the modulated signal;

a phase difference detecting means for detecting a phase difference between an output signal of the low pass filtering means and the reference signal;

a phase shifting means for calculating a phase shift quantity of the carrier so as to extinguish a phase error of the demodulated baseband signal based on a detected phase difference detected by the phase difference detecting means when having received the indication signal; and a demodulating means for demodulating the demodulated baseband signal from the carrier that has been phase-shifted by the phase sifting means and an output signal of the amplifier.

The above object is achieved by a feedback control method for a negative feedback amplifier, the method comprising the steps of:

demodulating a demodulated baseband signal from a carrier and an output of an amplifier;

detecting a phase error of the demodulated baseband signal caused by a delay in the amplifier for each change of a sending frequency of the carrier; and correcting the phase error of the demodulated baseband signal based on a detected phase error of the demodulated baseband signal.

Moreover, it is desirable that the step of detecting the phase error further comprises:

subtracting the demodulated baseband signal from a reference signal and outputting a subtraction signal; and detecting a phase difference between the reference signal and the subtraction signal.

Moreover, it is desirable that the step of correcting the phase error includes a step of controlling the phase of an output signal of the amplifier so as to extinguish the phase error of the demodulated baseband signal based on a detected phase error of the demodulated baseband signal.

Moreover, it is desirable that the step of correcting the phase error includes a step of controlling the phase of the carrier based on a detected phase error of the demodulated baseband signal.

If the sending frequency is changed in a system that changes the sending frequency, a negative-feedback amplifier of the present invention prevents deterioration of the open-loop gain and distorting improvement effect by detecting a phase difference for each frequency change using a reference signal and compensating for the phase difference.

DETAILED DESCRIPTION OF THE INVENTION

Figure 1:
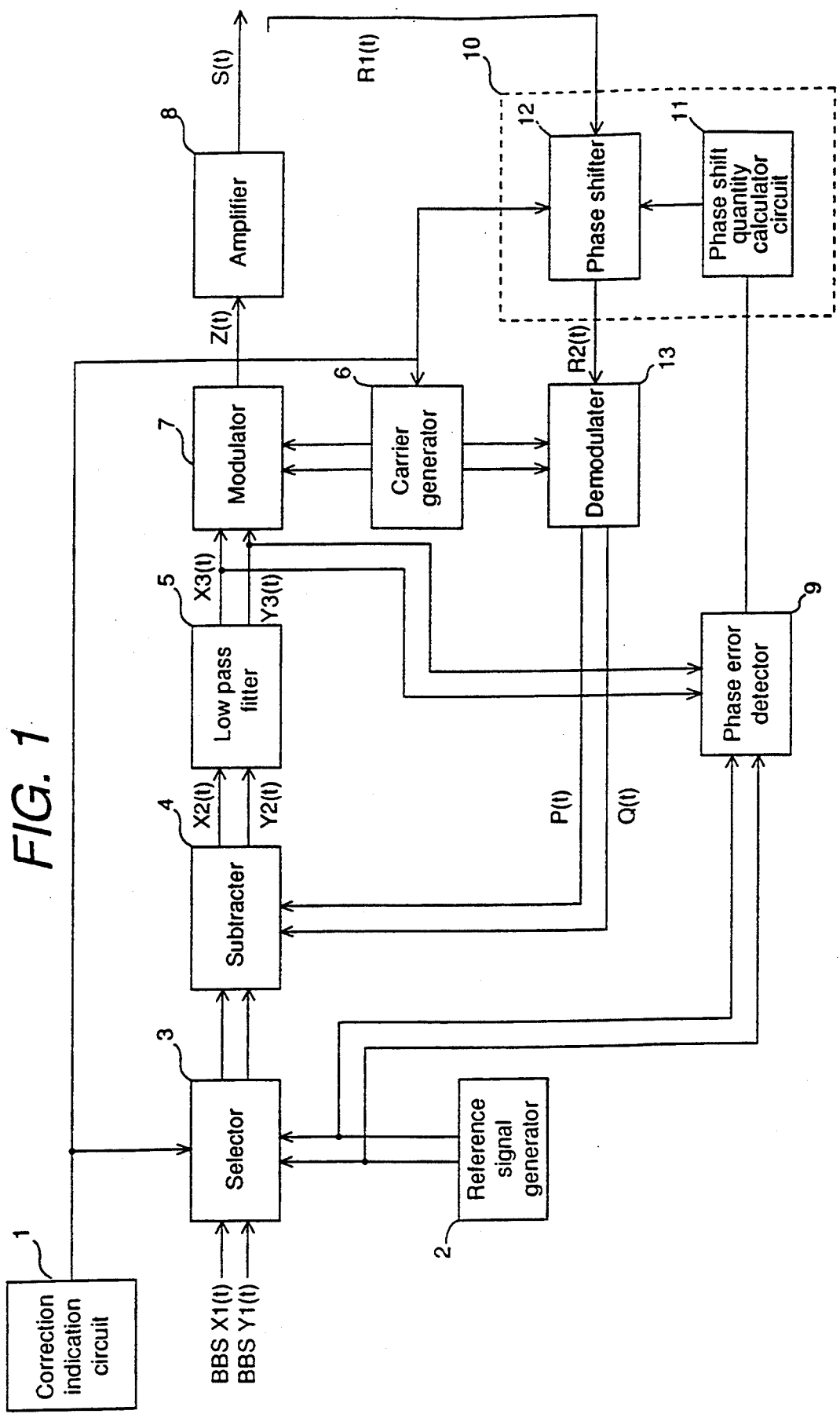
FIG. 1 is a block diagram of a negative-feedback amplifier showing the first embodiment of the present invention.

FIG. 1 is a block diagram of a negative-feedback amplifier showing the first embodiment of the present invention.

A correction indication circuit 1 is provided for generating a correction indication signal to indicate a change of a sending frequency and for correction control.

A reference signal generator circuit 2 is also provided for generating a reference signal that is a reference for detecting a phase difference described later.

A selector 3 is provided for receiving a reference signal and a two-dimensional baseband signal X1(t), Y1(t). The selector is configured so as to ordinarily output a two-dimensional baseband signal X1(t), Y1(t) and output a reference signal when a correction indication signal is supplied.

A subtracter 4 is provided for subtracting a two-dimensional demodulated baseband signal P(t), Q(t), described later, from the two-dimensional baseband signal X1(t), Y1(t) and for outputting a two-dimensional signal X2(t), Y2(t).

A low pass filter 5 is provided for limiting the frequency band of the two-dimensional signal X2(t), Y2(t) and outputting a two-dimensional signal X3(t), Y3(t).

A carrier generator circuit 6 is provided for generating and outputting a two-dimensional signal. When the carrier generator circuit 6 has received a correction indication signal, the carrier generator circuit 6 changes the generating sending frequency of the two-dimensional carrier signal and generates and outputs a predetermined two-dimensional carrier signal.

A modulator 7 is provided for QA-modulating a two-dimensional carrier signal with the two-dimensional signal X3(t), Y3(t) and for outputting a modulated signal z(t).

An amplifier 8 is provided for amplifying the modulated signal Z(t) output from the modulator 7, outputting an amplified signal S(t), sending out S(t) through an antenna (not shown in the figure), as well as, returning a part of S(t) as R1(t).

A phase difference detector circuit 9 is provided for detecting a phase difference between the two-dimensional signal X3(t), Y3(t) output from the low pass filter 5 and the reference signal.

A phase control circuit 10 comprising a phase shift quantity calculator circuit 11 and a phase shifter 12 is also provided.

When receiving a correction indication signal, the phase shift quantity calculator circuit 11 calculates a phase shift quantity of the amplified signal R1(t), using a phase difference detected by the phase difference detector circuit 9, so as to extinguish a phase error of the two-dimensional demodulated baseband signal P3(t), Q3(t) generated in the amplifier by changing a sending frequency.

A phase shifter 12 is provided for shifting a phase of the amplified signal R1(t) based on a phase shift quantity calculated by the phase shift quantity calculator circuit 11, and for outputting the signal R2(t).

A demodulator 13 is provided for demodulating the two-dimensional demodulated baseband signal P3(t), Q3(t) from the signal R2(t) and the carrier signal.

Next, the operation of this negative-feedback amplifier is explained.

First, an ordinary operation is explained.

The selector 3 outputs the two-dimensional baseband signal X1(t), Y1(t). Then, the subtracter 4 subtracts the two-dimensional demodulated baseband signal P(t), Q(t) from the two-dimensional baseband signal X1(t), Y1(t) and outputs the two-dimensional signal X2(t), Y2(t) represented by the equation (7) and (8).

$$X2(t) = X1(t) - P(t) \quad (7)$$

$$Y2(t) = Y1(t) - Q(t) \quad (8)$$

The low pass filter 5 prevents oscillation by stopping passage of a high frequency component that causes positive feedback by phase rotation in the amplifier 8. The output, the two-dimensional signal X3(t), Y3(t) is represented by equations (9) and (10), where a gain in the passage area of the low pass filter 5 is M.

$$X3(t) = M \times X2(t) \quad (9)$$

$$Y3(t) = M \times Y2(t) \quad (10)$$

Next, the demodulator 7 QA-modulates the two-dimensional carrier signal $\cos(\omega c \times t)$, $\sin(\omega c \times t)$ output from the carrier generator 6 with this two dimensional signal X3(t), Y3(t), and outputs the modulated signal Z(t) represented by the equation (11).

$$Z(t) = X3(t) \times \cos(\omega c \times t) + Y3(t) \times \sin(\omega c \times t) \quad (11)$$

Then, the modulated signal Z(t) is amplified by the amplifier 8 and sent out through an antenna, etc. (not shown in the figure).

Next, a part of output of the amplifier 8 is supplied to the phase shifter 12. If the phase component of distortion generated in the amplifier 8, which is equal to that of the baseband signal, is A(t) and the orthogonal component is B(t), the signal R1(t) supplied to the phase shifter 12 is represented by the equation (12).

$$R1(t) = G \times R \times \{X3(t-\delta) + A(t)\} \times \cos(\omega c \times (t-\delta)) + \\ G \times R \times \{Y3(t-\delta) + B(t)\} \times \sin(\omega c \times (t-\delta)) \quad (12)$$

Where, G is a gain of the amplifier 8 and R is a ratio of a part of the output of the amplifier 8 distributed to the phase control circuit 10.

The output signal R2(t) is represented by the equation (13) when the phase shifter 12 adjusts the phase for $\omega c \times \tau$.

$$= G \times R \times \{X3(t-\delta) + A(t)\} \times \cos(\omega c \times (t-\delta-\tau)) + G \times R \times \{Y3(t-\delta) + B(t)\} \times \sin(\omega c \times (t-\delta-\tau)) \quad (13)$$

The demodulator 13 performs demodulation using the output signal R2(t) of the phase shifter 12 and the two-dimensional carrier signal $\cos(\omega c \times t)$, $\sin(\omega c \times t)$ output from the carrier generator 5, and outputs the two-dimensional demodulated baseband signal P(t), Q(t) represented by the equations (14) and (15).

$$P(t) = G \times R \times \{X3(t-\delta) + A(t)\} \times \cos(\omega c \times (\delta+\tau)) - \\ G \times R \times \{Y3(t-\delta) + B(t)\} \times \sin(\omega c \times (\delta+\tau)) \quad (14)$$

$$Q(t) = G \times R \times \{Y3(t-\delta) + B(t)\} \times \cos(\omega c \times (\delta+\tau)) + \\ G \times R \times \{X3(t-\delta) + A(t)\} \times \sin(\omega c \times (\delta+\tau)) \quad (15)$$

The phase shifter 12 adjusts $\omega c \times \pi$ so as to realize the equation (16) for the two-dimensional demodulated baseband signal P(t), Q(t) in the equations (14) and (15).

$$\omega c \times (\delta + \pi) = 2 \times n \times \pi \text{ (n is an integer)} \quad (16)$$

Ordinarily, the two-dimensional demodulated baseband signal P(t), Q(t) is fed back as described above.

However, if the delay $\delta$ in the amplifier 6 has frequency characteristics and the carrier angular frequency $\omega c$, that is a sending frequency, is changed, its open-loop gain and distortion improvement effect are deteriorated because the equation (6) is not realized.

For this reason, when changing the sending frequency, phase control is performed before sending the two-dimensional baseband signal X1(t), Y1(t).

Next, the phase control operation is explained.

First, the correction indication circuit 1 outputs a correction indication signal to the carrier generator circuit 6, the selector 2 and the phase control circuit 10.

When the carrier generator circuit 6 has received the correction indication signal, it changes the sending frequency and generates a new carrier angular frequency $\omega c'$ and outputs it.

Also, when the selector 1 has received the correction signal, it outputs the reference signal $\cos(\omega n \times t)$, $\sin(\omega n \times t)$ output from the reference signal generator circuit 2 to the subtracter 4.

Then, the two-dimensional demodulated baseband signal P(t), Q(t) is subtracted from the reference signal $\cos(\omega n \times t)$, $\sin(\omega n \times t)$, and output to the low pass filter 5.

The low pass filter 5 limits the frequency band of this signal and outputs it. At this time, if $M \times G \times R$ is larger sufficiently than 1, the output signal of the low pass filter 5, the two-dimensional signal X3(t), Y3(t) can be approximated by the equations (17) and (18).

$$X3(t) = \cos\{\omega n \times t + \omega c' \times (\delta' + \tau)\}/(G \times R) \quad (17)$$

$$Y3(t) = \sin\{\omega n \times t + \omega c' \times (\delta' + \tau)\}/(G \times R) \quad (18)$$

Where, the phase $\omega c' \times (\delta' + \tau)$ is a phase difference caused by the two-dimensional demodulated baseband signal P(t), Q(t) output from the demodulator 13.

Next, the phase difference detector circuit 9 detects the phase difference $\omega c' \times (\delta' + \tau)$ based on the two-dimensional signal X3(t), Y3(t) and the reference signal $\cos(\omega n \times t)$, $\sin(\omega n \times t)$, and outputs it to the phase shift quantity calculator circuit 11.

When the phase shift quantity calculator circuit 11 has received the correction indication signal, it starts to calculate a phase shift quantity of the signal R1(t) based on the phase difference $\omega c' \times (\delta' + \tau)$ output from the phase difference detector 9.

That is, if the phase difference $\omega c' \times (\delta' + \tau)$ is in the range of the equation (19), it gradually decreases the phase $\omega c' \times \tau$ and calculates the phase shift quantity so that the phase difference $\omega c' \times (\delta' + \tau)$ may come close to $2 \times n \times \tau$.

$$2 \times n \times \pi \leq \omega c' \times (\delta' + \tau) < (2 \times n + 1) \times \pi \quad (19)$$

Also, if the phase difference $\omega c' \times (\delta' + \tau)$ is in the range of the equation (20), it gradually increases the phase $\omega c \times \tau$ and calculates the phase shift quantity so that the phase difference $\omega c' \times (\delta' + \tau)$ may come close to $2 \times n \times \tau$.

$$(2 \times n - 1) \times \pi \leq \omega c' \times (\delta' + \tau) < 2 \times n \times \tau \quad (20)$$

The phase shift quantity thus calculated is output to the phase shifter 12.

The phase shifter 12 stores the newly calculated phase shift quantity instead of a phase shift quantity previously stored, and controls the phase of the signal R(1) from the amplifier 8 with this new phase shift quantity.

After completion of the phase correction, output of the phase correction signal is stopped, the two-dimensional baseband signal X1(t), Y1(t) is output from the selector 1 and normal transmission is started.

In this manner, if the sending frequency is changed, this system detects the phase difference $\omega c \times (\delta + \tau)$ and performs a phase correction using the reference signal $\cos(\omega n \times t)$, $\sin(\omega n \times t)$, so that it can prevent deterioration of the open-loop gain and the distortion improvement effect.

Next, the second embodiment is explained.

Figure 2:
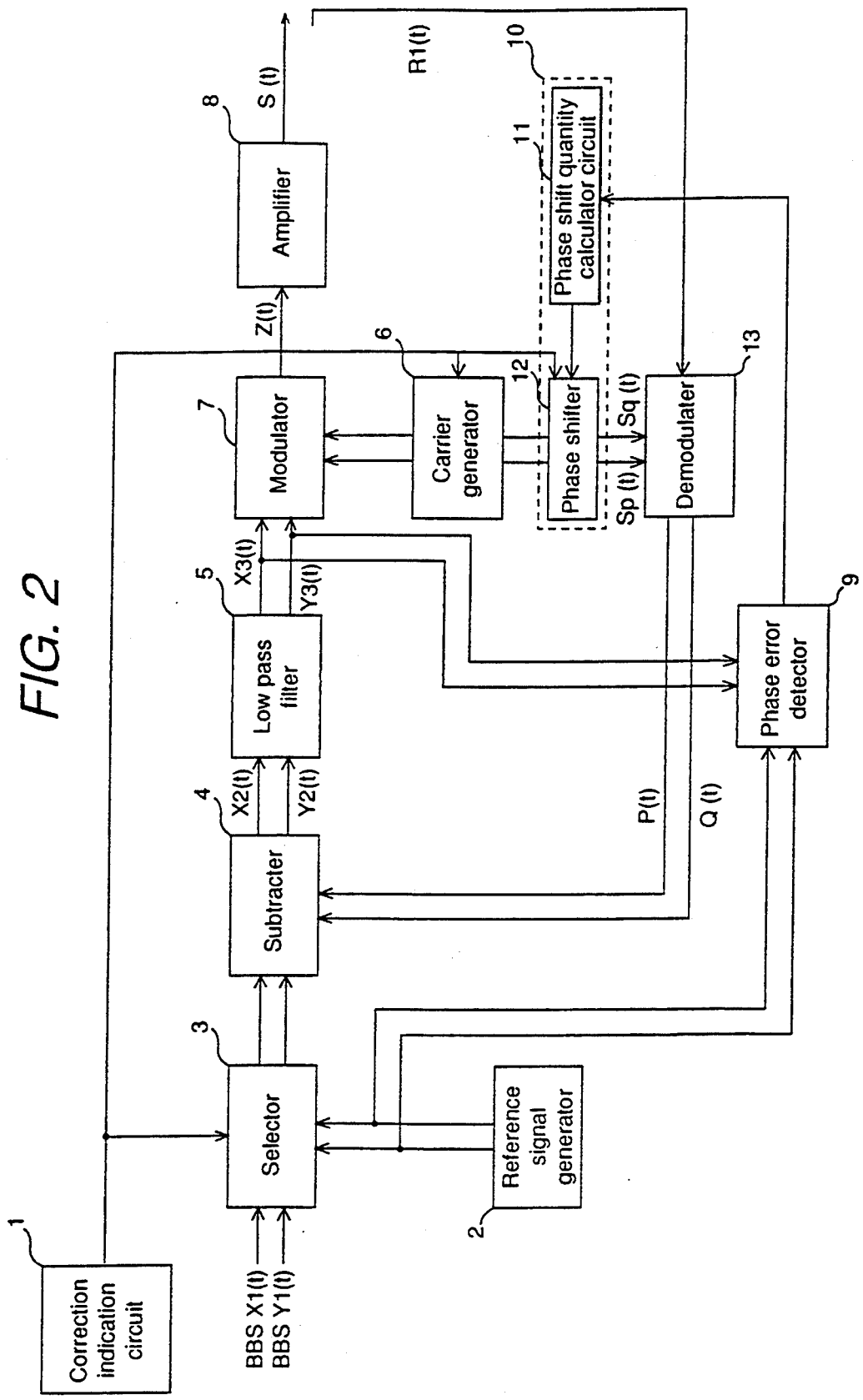
FIG. 2 is a block diagram of a negative-feedback amplifier showing the second embodiment of the present invention.
Figure 3:
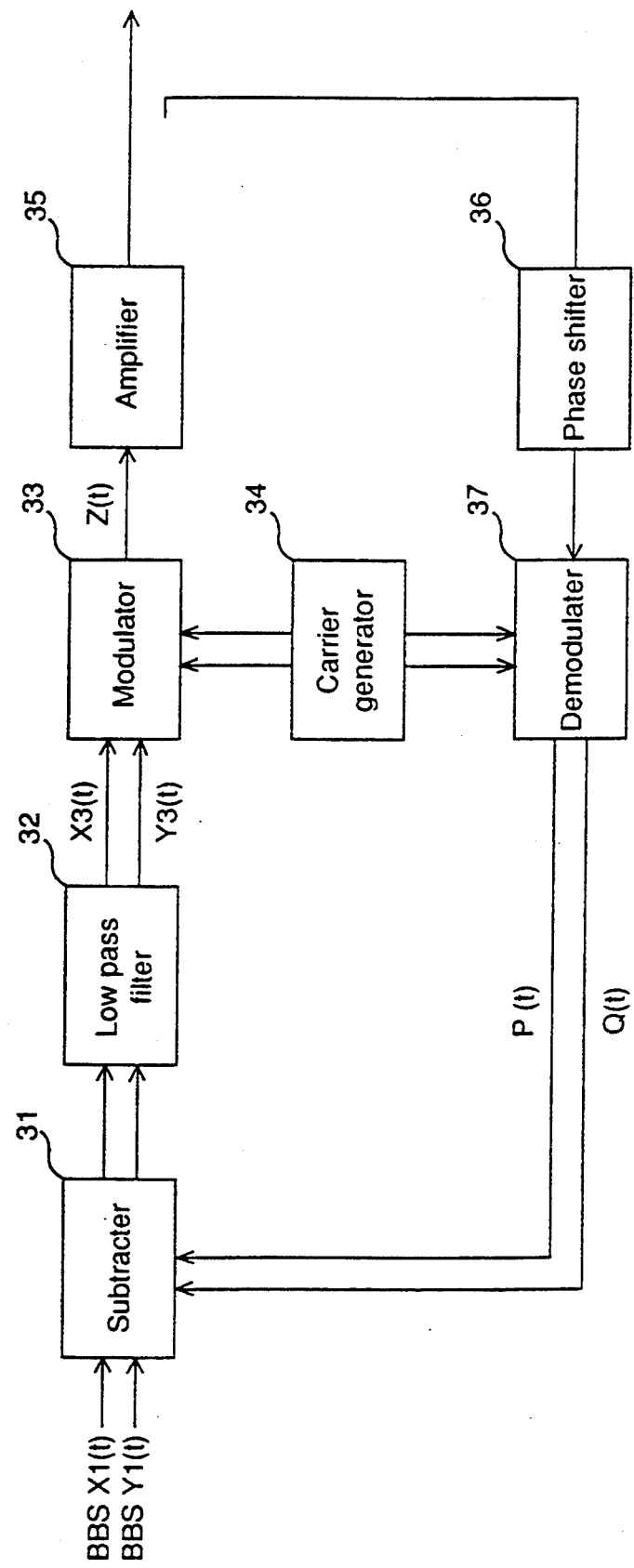
FIG. 3 is a block diagram of a negative-feedback amplifier of the prior art.

The second embodiment is configured as shown in FIG. 2, where the phase control circuit 10 of the first embodiment is moved to a location between the carrier generator circuit 6 and the demodulator 13. Therefore, the remaining configuration of the second embodiment is the same as the first configuration, so that a detailed explanation is omitted and only the operation is explained.

First, a normal operation is explained.

The selector 3 outputs the two-dimensional baseband signal X1(t), Y1(t). Then, the subtracter 4 subtracts the two-dimensional demodulated baseband signal P(t), Q(t) from the two-dimensional baseband signal X1(t), Y1(t) and outputs the two-dimensional signal X2(t), Y2(t) represented by the equations (21) and (22).

$$X2(t) = X1(t) - P(t) \quad (21)$$

$$Y2(t) = Y1(t) - Q(t) \quad (22)$$

The low pass filter 5 prevents oscillation by stopping passage of a high frequency component that causes positive feedback by phase rotation in the amplifier 8. The output, the two-dimensional signal X3(t), Y3(t) are represented by equations (23) and (24), where a gain in the passage area of the low pass filter 5 is M.

$$X3(t) = M \times X2(t) \quad (23)$$

$$Y3(t) = M \times Y2(t) \quad (24)$$

Next, the demodulator 7 QA-modulates the two-dimensional carrier signal $\cos(\omega c \times t)$, $\sin(\omega c \times t)$ output from the carrier generator 6 with the two dimensional signal X3(t), Y3(t), and outputs the modulated signal Z(t) represented by the equation (25).

$$Z(t) = X3(t) \times \cos(\omega c \times t) + Y3(t) \times \sin(\omega c \times t) \quad (25)$$

Then, the modulated signal Z(t) is amplified by the amplifier 8 and sent out through an antenna, etc. (not shown in the figure).

Next, a part of the output of the amplifier 8 is supplied to the demodulator 13. If the phase component of distortion generated in the amplifier 8, which is equal to that of the baseband signal, is A(t) and the quadrature component is B(t), the signal R1(t) supplied to the demodulator 13 is represented by the equation (26).

$$R1(t) = G \times R \times \{X3(t - \delta) + A(t)\} \times \cos\{\omega c \times (t - \delta)\} + G \times R \times \{Y3(t - \delta) + B(t)\} \times \sin\{\omega c \times (t - \delta)\} \quad (26)$$

On the other hand, the two-dimensional carrier signal $\cos(\omega c \times t)$, $\sin(\omega c \times t)$ output from the carrier generator circuit 6 is supplied to the phase shifter 12.

Then, the phase shifter 12 adjusts the phase for $\omega c \times \tau$, and outputs the output signal $Sp(t)$, $Sq(t)$ represented by the equations (27) and (28).

$$Sp(t) = \cos\{\omega c \times (\delta + \tau)\} \quad (28)$$

$$Sp(t) = \sin\{\omega c \times (\delta + \tau)\} \quad (29)$$

Next, the demodulator 13 performs demodulation using the output signal $R1(t)$ of the amplifier 8 and the output signal $Sp(t)$, $Sq(t)$ of the phase shifter 12, and outputs the two-dimensional demodulated baseband signal $P(t)$, $Q(t)$ represented by the equations (30) and (31).

$$P(t) = G \times R \times \{X3(t - \delta) + A(t)\} \times \cos\{\omega c \times (\delta + \tau)\} - G \times R \times \{Y3(t - \delta) + B(t)\} \times \sin\{\omega c \times (\delta + \tau)\} \quad (30)$$

$$Q(t) = G \times R \times \{Y3(t - \delta) + B(t)\} \times \cos\{\omega c \times (\delta + \tau)\} + G \times R \times \{X3(t - \delta) + A(t)\} \times \sin\{\omega c \times (\delta + \tau)\} \quad (31)$$

The phase shifter 12 adjusts $\omega c \times \tau$ so as to satisfy the equation (32) for the two-dimensional demodulated baseband signal $P(t)$, $Q(t)$ in the equation (30) and (31).

$$\omega c \times (\delta + \tau) = 2 \times n \times \pi \text{ (n is an integer)} \quad (32)$$

In general, the two-dimensional demodulated baseband signal $P(t)$, $Q(t)$ is fed back as described above.

However, if the delay 8 in the amplifier 8 has frequency characteristics and the carrier angular frequency $\omega c$, that is a sending frequency, is changed, its open-loop gain and distortion improvement effect are deteriorated because the equation (16) is not realized.

For this reason, when changing the sending frequency, phase control is performed before sending the two-dimensional baseband signal $X1(t)$, $Y1(t)$.

Next, the phase control operation is explained.

First, the correction indication circuit 1 outputs a correction indication signal to the carrier generator circuit 6, the selector 3 and the phase control circuit 10.

When the carrier generator circuit 6 has received the correction indication signal, it changes the sending frequency and generates a new carrier angular frequency $\omega c'$ and outputs it.

Also, when the selector 3 has received the correction signal, it outputs the reference signal $\cos(\omega n \times t)$, $\sin(\omega n \times t)$, output from the reference signal generator circuit 2 to the subtracter 4.

Then, the two-dimensional demodulated baseband signal $P(t)$, $Q(t)$ is subtracted from the reference signal $\cos(\omega n \times t)$, $\sin(\omega n \times t)$, and output from the low pass filter 5.

The low pass filter 5 limits the frequency band of this signal and outputs it. At this time, if $M \times G \times R$ is sufficiently larger than 1, the output signal of the low pass filter 5, the two-dimensional signal $X3(t)$, $Y3(t)$ can be approximated by the equations (33) and (34).

$$X3(t) = \cos\{\omega n \times t + \omega c' \times (\delta' + \tau)\}/(G \times R) \quad (33)$$

$$Y3(t) = \sin\{\omega n \times t + \omega c' \times (\delta' + \tau)\}/(G \times R) \quad (34)$$

Where, the phase $\omega c' \times (\delta' + \tau)$ in the equations (33) and (34) is a phase difference caused by the two-dimensional demodulated baseband signal $P(t)$, $Q(t)$ output from the demodulator 13.

Next, the phase difference detector circuit 9 detects the phase difference $\omega c' \times (\delta' + \tau)$ based on the two-dimensional signal $X3(t)$, $Y3(t)$ and the reference signal $\cos(\omega n \times t)$, $\sin(\omega n \times t)$, and outputs it to the phase shift quantity calculator circuit 11.

When the phase shift quantity calculator circuit 11 has received the correction indication signal, it starts to calculate a phase shift quantity of the two-dimensional carrier signal $\cos(\omega c \times t)$, $\sin(\omega c \times t)$ based on the phase difference $\omega c' \times (\delta' + \tau)$ output from the phase difference detector 9.

That is, if the phase difference $\omega c' \times (\delta' + \tau)$ is in the range of the equation (35), it gradually decreased the phase $\omega c' \times \tau$ and calculates the phase shift quantity so that the phase difference $\omega c' \times (\delta' + \tau)$ may come close to $2 \times n \times \pi$.

$$2 \times n \times \pi \leq \omega c' \times (\delta' + \tau) < (2 \times n + 1) \times \pi \quad (35)$$

Also, if the phase difference $\omega c' \times (\delta' + \tau)$ is in the range of the equation (36), it gradually increases the phase $\omega c' \times \tau$ and calculates the phase shift quantity so that the phase difference $\omega c' \times (\delta' + \tau)$ may come close to $2 \times n \times \pi$.

$$(2 \times n - 1) \times \pi \leq \omega c' \times (\delta' + \tau) < 2 \times n \times \pi \quad (36)$$

The phase shift quantity thus calculated is output to the phase shifter 12.

The phase shifter 12 stores the newly calculated phase shift quantity instead of a phase shift quantity previously stored, and controls the phase of the two-dimensional carrier signal $\cos(\omega c' \times t)$, $\sin(\omega c' \times t)$ with this phase shift quantity.

After completion of the phase correction, output of the phase correction signal is stopped, the two-dimensional baseband signal $X1(t)$, $Y1(t)$ is output from the selector 3 and ordinary transmission is started.

By controlling the phase of the two-dimensional carrier signal, the same effect as that of the first embodiment can be obtained.

What is claimed is:

1. A negative-feedback amplifier that demodulates a baseband signal from a carrier and an output signal of an amplifier and feed back a demodulated base band signal, comprising a correcting means for correcting a phase error of said demodulated baseband signal caused by delay in said amplifier for each change of a sending frequency of said carrier.

2. The negative-feedback amplifier of claim 1, wherein said correcting means comprises:
   a detecting means for detecting said phase error of said demodulated baseband signal caused by delay in said amplifier for each change of said sending frequency of said carrier; and
   a first phase controlling means for controlling the phase of said output signal of said amplifier so as to extinguish said phase error of said demodulated baseband signal based on a detected phase error of said demodulated baseband signal.

3. The negative-feedback amplifier of claim 2, wherein said detecting means comprises:
- a reference signal generating means for generating a reference signal;
- a subtracting means for subtracting said demodulated baseband signal from said reference signal and outputting a subtraction signal; and
- a phase difference detecting means for detecting a phase difference between said reference signal and said subtraction signal.

4. The negative-feedback amplifier of claim 2, wherein said first phase controlling means comprises:
- a phase shift quantity calculating means for calculating a phase shift quantity of said output signal of said amplifier so as to extinguish said phase error of said demodulated baseband signal based on a detected phase difference; and
- a phase shifting means for receiving a phase shift quantity calculated by said phase shift quantity calculating means and shifting the phase of said output signal of said amplifier based on said phase shift quantity.

5. The negative-feedback amplifier of claim 2, comprising a second phase controlling means for controlling the phase of said carrier so as to extinguish said phase error of said demodulated baseband signal based on a detected phase error of said demodulated baseband signal.

6. The negative-feedback amplifier of claim 5, wherein said second phase controlling means comprises:
- a phase shift quantity calculating means for calculating a phase shift quantity of said carrier so as to extinguish said phase error of said demodulated baseband signal based on a detected phase difference; and
- a phase shifting means for receiving said phase shift quantity calculated by said phase shift quantity calculating means and shifting the phase of said carrier based on said phase shift quantity.

7. The negative-feedback amplifier of claim 1, wherein said correction means comprises:
- a reference signal generating means for generating a reference signal;
- a subtracting means for subtracting said demodulated baseband signal from said reference signal and outputting a subtraction signal;
- a phase difference detecting means for detecting a phase difference between said reference signal and said subtraction signal;
- a phase shift quantity calculating means for calculating a phase shift quantity of an output signal of said amplifier so as to extinguish said phase error of said demodulated baseband signal based on a detected phase difference; and
- a phase shifting means for receiving said phase shift quantity calculated by said phase shift quantity calculating means and shifting the phase of said output signal of said amplifier based on said phase shift quantity.

8. The negative-feedback amplifier of claim 7, wherein said correcting means comprises:
- an indicating means for outputting an indication signal to indicate start of correction for said phase error of said demodulated baseband signal; and
- a selecting means for outputting a reference signal supplied from said reference signal generating means when having received said indication signal.

9. The negative-feedback amplifier of claim 1, wherein said correcting means comprises:
- a reference signal generating means for generating a reference signal;
- a subtracting means for subtracting said demodulated baseband signal from said reference signal and outputting a subtraction signal;
- a phase difference detecting means for detecting a phase difference between said reference signal and said subtraction signal;
- a phase shift quantity calculating means for calculating a phase shift quantity of said carrier so as to extinguish said phase error of said demodulated baseband signal based on a detected phase difference; and
- a phase shifting means for receiving said phase shift quantity calculated by said phase shift quantity calculating means and shifting the phase of said carrier based on said phase shift quantity.

10. The negative-feedback amplifier of claim 9, wherein said correcting means comprises:
- an indicating means for outputting an indication signal to indicate start of correction for said phase error of said demodulated baseband signal; and
- a selecting means for outputting a reference signal supplied from said reference signal generating means when having received said indication signal.

11. A negative-feedback amplifier comprising:
- an indicating means for outputting a correction indication signal to indicate start of correction and change of said sending frequency;
- a carrier generating means for generating a predetermined carrier by changing said sending frequency when having received said correction indication signal;
- a reference signal generating means for generating a reference signal;
- a selecting means for receiving a demodulated baseband signal and said reference signal and outputting said baseband signal in a normal operation, and outputting said reference signal when having received said correction indication signal;
- a subtracting means for subtracting said demodulated baseband signal from an output of said selector;
- a low pass filtering means for receiving an output signal of said subtracter and limiting the frequency band of said output signal of said subtracter;
- a modulating means if or modulating said carrier with an output signal of said low pass filtering means and outputting a modulated signal;
- an amplifying means for amplifying said modulated signal;
- a phase difference detecting means for detecting a phase difference between an output signal of said low pass filtering means and said reference signal;
- a phase shifting means for calculating a phase shift quantity of said output signal of said amplifying means so as to extinguish a phase error of said demodulated baseband signal based on a detected phase difference detected by said phase difference detecting means when having received said indication signal; and
- a demodulating means for demodulating said demodulated baseband signal from said carrier and an output signal of said amplifier that has been phase-shifted by said phase sifting means.

12. A negative-feedback amplifier comprising:

an indicating means for outputting a correction indication signal to indicate start of correction and change of a sending frequency;

a carrier generating means for generating a predetermined carrier by changing said sending frequency when having received said correction indication signal;

a reference signal generating means for generating a reference signal;

a selecting means for receiving a demodulated baseband signal and said reference signal and outputting said baseband signal in a normal operation, and outputting said reference signal when having received said correction indication signal;

a subtracting means for subtracting said demodulated baseband signal from an output of said selector;

a low pass filtering means for receiving an output signal of said subtracter and limiting a frequency band of said output signal of said subtracter;

a modulating means for modulating said carrier with an output signal of said low pass filtering means;

an amplifying means for amplifying said modulated signal;

a phase difference detecting means for detecting a phase difference between an output signal of said low pass filtering means and said reference signal;

a phase shifting means for calculating a phase shift quantity of said carrier so as to extinguish a phase error of said demodulated baseband signal based on a detected phase difference detected by said phase difference detecting means when having received said indication signal; and a demodulating means for demodulating said demodulated baseband signal from said carrier that has been phase-shifted by said phase sifting means and an output signal of said amplifier.

13. A feedback control method for a negative feedback amplifier comprising the steps of:

demodulating a baseband signal from a carrier and an output signal of an amplifier;

detecting a phase error of said demodulated baseband signal caused by delay in said amplifier for each change of a sending frequency of said carrier; and correcting sa phase error of said demodulated baseband signal based on a detected phase error of said demodulated baseband signal.

14. The feedback control method for a negative feedback amplifier of claim 13, wherein said step of detecting comprises the steps of:

subtracting said demodulated baseband signal from a reference signal and outputting a subtraction signal; and detecting a phase difference between said reference signal and said subtraction signal.

15. The feedback control method for a negative feedback amplifier of claim 13, wherein said step of correcting includes a step of controlling the phase of said output signal of said amplifier so as to extinguish said phase error of said demodulated baseband signal based on a detected phase error of said demodulated baseband signal.

16. The feedback control method for a negative feedback amplifier of claim 13, wherein said step of correcting a step of controlling the phase of said carrier based on a detected phase error of said demodulated baseband signal.

* * * * *